US006531331B1

(12) United States Patent
Bennett et al.

(10) Patent No.: US 6,531,331 B1
(45) Date of Patent: Mar. 11, 2003

(54) MONOLITHIC INTEGRATION OF A MOSFET WITH A MEMS DEVICE

(75) Inventors: Reid Bennett, Albuquerque, NM (US); Bruce Draper, Albuquerque, MN (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/197,202

(22) Filed: Jul. 16, 2002

(51) Int. Cl.$^7$ ................................................. H01L 21/00
(52) U.S. Cl. ........................ 438/48; 438/561; 438/702; 438/142
(58) Field of Search ................................ 216/2; 438/48, 438/51, 52, 53, 50, 6, 128, 142, 301, 558, 561, 591, 592, 702, 778, 637

(56) References Cited

U.S. PATENT DOCUMENTS

| | | | |
|---|---|---|---|
| 5,326,726 A | 7/1994 | Tsang et al. | |
| 5,798,283 A | 8/1998 | Montague et al. | |
| 5,905,571 A | 5/1999 | Butler et al. | |
| 5,919,548 A | 7/1999 | Barron et al. | |
| 5,963,788 A | 10/1999 | Barron et al. | |
| 6,082,208 A | 7/2000 | Rodgers et al. | |
| 6,087,701 A * | 7/2000 | Bergstrom et al. | 257/414 |
| 6,174,820 B1 * | 1/2001 | Habermehl et al. | 438/745 |
| 6,296,859 B1 * | 9/2001 | Fleming et al. | 216/2 |
| 6,329,274 B1 * | 11/2001 | Inoue et al. | 438/561 |
| 6,391,674 B2 * | 5/2002 | Ziegler | 438/52 |
| 6,472,694 B1 * | 10/2002 | Wilson et al. | 438/604 |
| 2002/0098611 A1 * | 7/2002 | Chang et al. | 438/50 |

OTHER PUBLICATIONS

Brosnihan et al, "Embedded interconnect and electrical siolation for higfh–aspect ratio, SOI inertial instruments" Tansducers 1997 IEEE 2D2.04.*
Cahvan et al, "A Monolithic Fully–Integrated Vacuum–sealed CMOS Pressure Sensor" IEEE Transactions on Electrical devices, vol. 49, No. 1 Jan. 2002.*
Smith, et al., "Embedded Micromechanical Devices for the Monolithic Integration of MEMS and CMOS," *Proc. Int. Electron Devices Mtg. IEDM'95*, 609 (1995).
Yee, et al., "An integration process of micro electro mechanical polysilicon with CMOS analog/digital circuits," *Sensors and Actuators* 78, 120 (1999).
Guillou, et al., "Laminated, sacrificial–poly MEMS technology in standard CMOS," *Sensors and Actuators* 85, 346 (2000).

(List continued on next page.)

Primary Examiner—Savitri Mulpuri
(74) Attorney, Agent, or Firm—Kevin W. Bieg

(57) ABSTRACT

An integrated microelectromechanical system comprises at least one MOSFET interconnected to at least one MEMS device on a common substrate. A method for integrating the MOSFET with the MEMS device comprises fabricating the MOSFET and MEMS device monolithically on the common substrate. Conveniently, the gate insulator, gate electrode, and electrical contacts for the gate, source, and drain can be formed simultaneously with the MEMS device structure, thereby eliminating many process steps and materials. In particular, the gate electrode and electrical contacts of the MOSFET and the structural layers of the MEMS device can be doped polysilicon. Dopant diffusion from the electrical contacts is used to form the source and drain regions of the MOSFET. The thermal diffusion step for forming the source and drain of the MOSFET can comprise one or more of the thermal anneal steps to relieve stress in the structural layers of the MEMS device.

19 Claims, 4 Drawing Sheets

OTHER PUBLICATIONS

Gianchandani, et al., "A fabrication process for integrating polysilicon microstructures with post–processed CMOS circuits," *J. Micromech. Microeng.* 10, 380 (2000).

Baltes, et al., "CMOS–based microsensors and packaging," *Sensors and Actuators* A92, 1 (2001).

Honer, et al., "Integration of sputtered silicon microstructures with prefabricated CMOS circuitry," *Sensors and Actuators* A91, 386 (2001).

S.M. Sze, *Physics of Semiconductor Devices*, $2^{nd}$ Ed. pp. 99–108 (1981).

* cited by examiner

MONOLITHIC INTEGRATION OF A MOSFET WITH A MEMS DEVICE

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to integrated microelectromechanical systems and, more particularly, to the monolithic integration of microelectronic circuitry with microelectromechanical devices on the same substrate or chip.

BACKGROUND OF THE INVENTION

Integrated microelectromechanical systems (iMEMS) combine microelectromechanical device structures with on-chip electronic circuitry. This integration can improve performance, reliability, and functionality and reduce size and cost over standard MEMS devices. For example, monolithic integration may reduce the number of input-output (I/O) bondpads required for electrical switching in a complex structure, improve the driving and control of microactuators, improve the amplification and/or processing of sensory signals generated by microsensors by reducing stray capacitance and sensitivity to noise, minimize die area, and enable batch fabrication. Furthermore, the high speed, dense switching enabled by on-chip integrated circuitry (e.g., a metal-oxide semiconductor field effect transistor, or MOSFET) cannot be achieved in micromechanical relays that are frequently used to switch MEMS devices. In particular, the reliability of MOSFET circuitry is well understood, whereas micromechanical relays are still being developed.

On-chip circuitry is particularly advantageous when used to control and drive complex MEMS devices, such as the Polychromator used for spectral identification. U.S. Pat. No. 5,905,571 to Butler et al. The Polychromator comprises an electrostatically actuated programmable diffraction grating with 1024 individually addressable diffractive elements. To actuate all of these diffractive elements independently presently requires an equal number of I/O bondpads hard-wired to a power source. This complex circuitry can have a deleterious effect on device yield and reliability. It is estimated that the number of wire bonds can be substantially reduced, perhaps to as few as 20–30 bondpads, by controlling the diffractive elements with on-chip electronic circuitry.

However, monolithic integration of electronic circuitry with a MEMS device presents serious materials and process compatibility challenges. A number of approaches have been developed to integrate electronic circuitry with a MEMS device on the same chip. U.S. Pat. No. 5,326,726 to Tsang et al. discloses an interleaved or merged process approach for fabricating a monolithic chip containing integrated circuitry interconnected to a microstructure (i.e., a MEMS device). The approach of Tsang et al. requires that the separate steps for forming the MEMS device and the integrated circuit be interleaved for compatibility, with the electronic circuitry being formed at least in part prior to the MEMS device, and electrical interconnections between the circuitry and the MEMS device being formed thereafter. While Tsang et al. use some essentially standard process steps, other process steps must be modified due to conflicting requirements between the circuitry and the MEMS device. The method of Tsang et al. comprises 67 processes which are further broken down into approximately 330 process steps.

Modification and interleaving of the process steps may significantly decrease the circuit performance and the overall process yield. These modified process steps are primarily dictated by thermal cycles and topography during processing. For example, MEMS devices frequently have severe topography, with structures extended several microns up from the substrate. This severe topography may require modifications to photolithography and etching processes for forming the electrical interconnections between the MEMS device and circuitry. In addition, a high-temperature annealing step is required to relieve stress in surface micromachined MEMS devices that use low-pressure chemical vapor deposition (LPCVD) of polysilicon as the structural material. This high-temperature annealing step may cause unwanted diffusion of dopants in the electronic circuitry. Furthermore, the high-temperature step necessitates refractory (e.g., tungsten) interconnect metallizations in place of traditional aluminum-metallized CMOS circuitry.

Many of these process modifications can be eliminated by substantially separating the process steps for the MEMS device from the process steps for fabricating the electronic circuitry, thereby allowing the use of standard process steps as known to the art, especially for fabricating the electronic circuitry. In a post-CMOS process, the MEMS device is fabricated after the electronic circuitry. Fabricating the circuitry first and then depositing and patterning the structural polysilicon avoids the problem with large topographical variations of the MEMS device structures from affecting the lithography for fabricating the circuitry, but severely limits the thermal budget for the MEMS device fabrication to that acceptable for the electronic circuitry. This restricted thermal budget can necessitate process and material property modifications from conventional surface micromachining processing and materials.

Alternatively, the MEMS device can be fabricated before the electronic circuitry. A pre-CMOS method of separating the process steps is disclosed in U.S. Pat. No. 5,798,283 to Montague et al., and U.S. Pat. No. 5,963,788 to Barron et al., which are incorporated herein by reference. The MEMS device can be fabricated within a shallow trench in a first portion of the substrate and encapsulated with a sacrificial material (e.g., silicon dioxide or a silicate glass). This embedded polysilicon microstructure allows the MEMS device to be annealed and the substrate planarized (e.g., by chemical-mechanical polishing) prior to fabricating the electronic circuitry on a second portion of the substrate using a series of standard processing steps. After fabrication of the electronic circuitry, the MEMS device can be released for operation by etching away the encapsulating sacrificial material. By fabricating the MEMS device prior to the electronic circuitry, this pre-CMOS method avoids subjecting the electronic circuitry to the high-temperature annealing step required to stress relieve the MEMS device. Consequently, standard CMOS process steps and uncomplicated lithography can be used. However, this method still requires many photolithographic masks (e.g., 25–30) and process steps (e.g., 500), because it requires separate fabrication processes for the MEMS device and the electronic circuitry.

A need still exists for a simple method to monolithically integrate a MOSFET with a MEMS device on a single chip. The present invention provides a simple method for iMEMS fabrication by taking advantage of the long, high-temperature annealing step of the MEMS process to provide for dopant diffusion to create the source and drain regions of a MOSFET. In effect, the present invention provides a means to use the MEMS process to create MOSFETs, thereby eliminating many process steps.

SUMMARY OF THE INVENTION

The method of the present invention for integrating a MOSFET with a MEMS device on a substrate comprises forming a gate insulator of the MOSFET on an electronics portion of the substrate; forming a gate electrode of the MOSFET on the gate insulator; forming an inter-layer dielectric on the electronics portion of the substrate, thereby encapsulating the gate electrode and the gate insulator, forming a gate electrical contact through the inter-layer dielectric to the gate electrode; forming a source electrical contact through the inter-layer dielectric to a source region of the substrate proximate to one side of the gate electrode wherein the source electrical contact further comprises a solid dopant source; forming a drain electrical contact through the inter-layer dielectric to a drain region of the substrate proximate to the other side of the gate electrode wherein the drain electrical contact further comprises a solid dopant source; forming a MEMS device structure on a MEMS portion of the substrate comprising at least one dielectric layer on the substrate, at least one structural layer built up from the at least one dielectric layer, and at least one sacrificial layer interleaving the at least one structural layer; heating the substrate to a sufficiently high temperature to thermally diffuse the dopant atoms from the source and drain electrical contacts into the substrate to form the source and drain of the MOSFET; forming electrical interconnections from the gate electrical contact, the source electrical contact, and the drain electrical contact of the MOSFET to the MEMS device structure; and removing the at least one sacrificial layer to release the MEMS device.

The gate insulator of the MOSFET can be formed simultaneously with the dielectric layer of the MEMS device. The gate electrode of the MOSFET can be formed simultaneously with a first structural layer of the MEMS device. Furthermore, the electrical contacts of the MOSFET can be formed from another structural layer of the MEMS device. Typically, the gate electrode and electrical contacts of the MOSFET and the structural layers of MEMS device can be doped polysilicon. Preferably, the thermal diffusion step can also thermally anneal the stress in the structural layers of the MEMS device. An nMOSFET can be formed in a p-type substrate or a p-type well using a donor atom as the thermally diffused dopant to form the source and drain. Alternatively, an n-type substrate can be used with an acceptor dopant to form a pMOSFET.

The present invention further comprises an integrated microelectromechanical system, comprising at least one MOSFET on an electronics portion of a substrate, further comprising a gate insulator on the substrate, a gate electrode on the gate insulator, a dopant-diffused source in the substrate proximate to one side of the gate electrode, a dopant-diffused drain in the substrate proximate to the other side of the gate electrode, an inter-layer dielectric on the electronics portion of the substrate that encapsulates the gate electrode and the gate insulator, a gate electrical contact through the inter-layer dielectric to the gate electrode, a source electrical contact through the inter-layer dielectric to the source, a drain electrical contact through the inter-layer dielectric to the drain; and at least one MEMS device on a MEMS portion of the substrate, further comprising at least one dielectric layer on the substrate and at least one structural layer built up on the at least one dielectric layer; and electrical interconnections from the gate electrical contact, source electrical contact, and drain electrical contact of the at least one MOSFET to the at least one MEMS device.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 1 is a schematic illustration of the method for monolithically integrating a MOSFET with a MEMS device.

DETAILED DESCRIPTION OF THE INVENTION

Figure 1A:
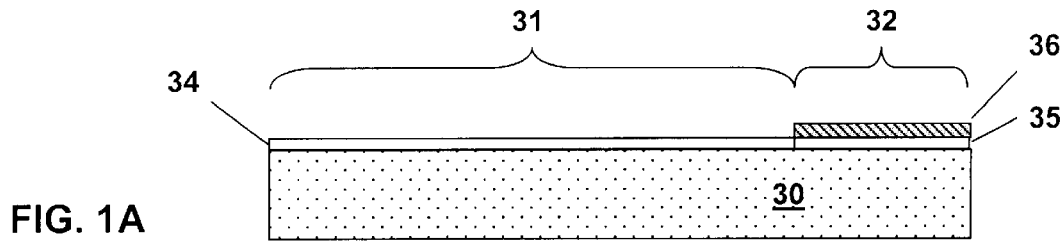
FIG. 1A shows the electronics portion and the MEMS portion of a common substrate.

Formation of a MEMS device can include surface and bulk micromachining processes. Surface micromachining comprises building up, layer by layer, the MEMS device structure on the surface of a substrate (e.g., a single crystal silicon wafer). In particular, polysilicon surface micromachining uses the planar fabrication techniques common to microelectronic circuit fabrication to manufacture the MEMS device. The multiple layers are built up using thin film depositions of low-stress polycrystalline silicon as a structural material and silicon dioxide as a sacrificial material. Photolithographic patterning and dry etching is generally used to define surface features in the deposited structural layers in the plane parallel to the substrate. Vias etched through the sacrificial layers provide anchor points between the mechanical layers and the substrate. High temperature annealing is required to relieve stresses in the deposited layers. Wet etching, for example in hydrofluoric acid (HF), can then be used to release the MEMS device by removing the sacrificial layers.

Generally, the functionality of the MEMS device increases with the number of structure layers. However, multilayer device fabrication can be complicated by surface topology, mechanical stress effects in the deposited films, and deformation of the wafer substrate. A typical polysilicon surface micromachining process is the five-level polysilicon process disclosed in U.S. Pat. No. 6,082,208 to Rodgers et al., which is incorporated herein by reference. This five-level process comprises five polysilicon layers, denoted P0, P1, P2, P3, and P4, and four intervening sacrificial oxide layers, denoted S1, S2, S3, and S4. The P0 layer is a non-construction polysilicon layer, used primarily for electrical interconnection and as a voltage reference plane, and P1 to P4 are the mechanical construction layers. The polysilicon layers are typically deposited as n-type, fine-grained polysilicon from silane in a low-pressure chemical vapor deposition (LPCVD) furnace at about 580° C. The deposited layers are typically only a few microns thick. The sacrificial oxide films are typically deposited as silicon dioxide in a LPCVD furnace from tetraethylorthosilicate (TEOS) at about 720° C.

The substrate can be a (100) n- or p-type silicon wafer, covered by a thermally grown oxide (e.g., 630 nanometers in thickness) followed by a low-stress LPCVD silicon nitride layer (e.g., 800 nanometers in thickness). The thermal oxide and low-stress silicon nitride layers provide electrical isolation of the subsequently deposited P0 layer of the MEMS device from the substrate. The P0 layer can be deposited as a phosphorous-doped LPCVD polysilicon film of about 300 nanometers thick to provide a voltage reference plane for the electrical elements of the MEMS device. The P0 layer can be photolithographically patterned and reactive ion plasma etched to provide the appropriate interconnect/electrode geometry.

Alternating layers of sacrificial oxide and polysilicon mechanical construction layers are then deposited, patterned, and etched to build up the MEMS device structure. Vias can be etched through the sacrificial layers to provide anchor points to the substrate and between the polysilicon layers to build up the mechanical elements of the MEMS device. A plurality of access holes can be formed through the polysilicon layers to expose the sacrificial layers to be etched. Chemical-mechanical polishing is used during the build-up to planarize the oxide layers to provide precise vertical dimensioning of the mechanical elements of the MEMS device and to remove the surface topography that is generated during the build-up prior to deposition of the next polysilicon layer. Since any stress in the mechanical elements can be detrimental to a MEMS device, several intermediate high temperature anneals are used to stress-relieve the polysilicon layers. A high temperature-annealing step for relieving the stress is also generally performed after deposition of the final polysilicon layer (e.g., the P4 layer). The annealing steps can comprise heating the substrate and MEMS device structure to a preselected temperature in the range of 700–1300° C. for several hours or more. Finally, a release step comprising removing or partially removing the exposed silicon dioxide sacrificial film with either an aqueous or vapor isotropic HF-based etch is used to yield a free-standing MEMS device.

Many hundreds of fully assembled MEMS devices can thereby be batch-fabricated on a single silicon substrate. Furthermore, quite complex structures can be built up using the polysilicon surface micromachining process described above, enabling the construction of highly functional MEMS devices. The total stack height of the MEMS device structure can be about 10 microns or greater. Hundreds of individual process steps can be used to build up a typical MEMS device structure, including the polysilicon or sacrificial layer deposition, photolithographic definition, and etching process steps that are repeated multiple times using approximately 14 photolithographic masks.

Electronic circuitry can be used to both control and drive a MEMS device. Actuation of a MEMS device can comprise converting electrical, magnetic, optical, or thermal energy into a mechanical motion output. Electrostatic actuation, in particular, has many advantages for surface-machined MEMS devices, including compatibility with voltage switching using integrated circuit electronics. Electrostatic actuation depends on the attractive force between two plates or surfaces carrying opposite charges. Field energy densities adequate to power most surface micromachined electrostatic actuators can be generated with voltages of 100 Volts or less. For example, electrostatic actuation of the diffractive elements of the Polychromator described above presently requires an applied voltage of about 80 Volts.

Electronic circuitry comprising MOSFETs is commonly used to control and drive MEMS devices. A typical MOSFET is a four-terminal device comprising a source and a drain separated by a channel region, wherein the current flow from the source to the drain is controlled by an overlying gate electrode that is insulated from the thin channel at the surface of the semiconductor substrate by a thin gate oxide. With an n-channel MOSFET (nMOSFET), a gate electrode controls electronic current flow from an n-type source to an n-type drain at the surface of a p-type silicon substrate that is typically held at ground potential. When there is no voltage applied to the gate or the gate voltage is negative, the p-type silicon surface is in accumulation or depletion and no current or only a small leakage current flows between the source and the drain. When a sufficiently large positive voltage (i.e., greater than the gate threshold voltage) is applied to the gate electrode, the silicon surface is inverted to n-type, and a conducting channel is formed between the n-type source and drain.

In a high-speed MOSFET found in most modern high-density circuits for digital applications, the doping for the source and drain regions is formed by ion implantation. Self-aligned ion implantation generally provides good control of the dopant location and concentration. A short, low-temperature anneal (e.g., 900° C. for one-half hour) is typically adequate to remove implant damage. In particular, because ion implantation is a low-temperature process, lateral diffusion of the dopant atoms can be avoided and very short channels can be realized, enabling higher-performance transistors.

The source and drain regions can also be doped by thermal diffusion, typically by deposition from a gas or vapor through a mask opening above the junction region in a high temperature diffusion furnace. In general, substantial lateral diffusion occurs any time the wafer is heated to a temperature range wherein diffusion movement can take place, typically above about 1000° C. Thermal diffusion can place some limits on MOSFET devices, due to lateral diffusion, doping control, and surface contamination interference. In particular, overlap capacitance due to excessive lateral diffusion of the source and drain under the gate can have a deleterious effect on MOSFET speed.

In the past, dopant diffusion during the high-temperature steps necessary to relieve stress in the MEMS device structure has complicated the fabrication of the ion-implanted MOSFET prior to the fabrication of the MEMS device structure. However, the present invention takes advantage of this high-temperature step to simultaneously thermally anneal the MEMS device structure and thermally diffuse dopant from a solid dopant source to form the source and drain regions of the MOSFET. Therefore, a primary advantage to integrating MOSFETs and MEMS according to the present invention is the savings in fabrication time and materials. Since the MOSFETs can be made simultaneously with the MEMS devices in a batch process, the need for additional processing and photolithographic masks is substantially eliminated.

Thermal diffusion does not enable the ultra shallow junctions and consequent high speed and high packing densities achievable with MOSFETs formed by ion implantation. However, this is not a serious limitation for iMEMS, since the packing density is primarily determined by the much larger physical dimensions of the MEMS device structure and the speed requirement of the mechanical MEMS device is generally much less (e.g., less than 100 kHz) than is required for high-speed digital applications (e.g., much greater than 100 MHz).

In FIG. 1 is shown a schematic illustration of the method for fabricating a MOSFET 10 that can be integrated with a MEMS device 20 on a common semiconductor substrate 30, according to the present invention. In general, one or more MOSFETs 10 can be fabricated on an electronics portion 31 of the substrate 30 and one or more MEMS devices 20 can be built up on a MEMS portion 32 of the substrate 30. An nMOSFET 10 comprises a p-type substrate 30 having n-type source 40 and n-type drain 50 separated by a channel region 45. The channel current is controlled by a voltage applied at a gate electrode 60 that is isolated from the channel 45 by a gate insulator 70. Electrical interconnects 90 connect the MOSFET 10 with the MEMS device 20 and other electrical circuitry.

In FIG. 1A, a semiconductor substrate 30 is provided upon which the nMOSFET 10 and the MEMS device 20 can be fabricated. The substrate 30 can be of standard CMOS quality, single crystal silicon with common dopants. The substrate can be p-type to form an nMOSFET and n-type to form a pMOSFET. For example, for an nMOSFET, the substrate 30 can be a (100) p-type silicon wafer that is lightly doped with acceptor atoms (e.g., $10^{15}$–$10^{16}$ atoms/cc). Alternatively, the nMOSFET can be fabricated inside a p-type well (not shown) that can be formed by ion implantation or thermal diffusion in an n-type silicon substrate. The doping concentration in the well can be adjusted to be similar to that for the doped wafer (i.e., $10^{15}$–$10^{16}$ atoms/cc). In general, the silicon wafer 30 can be large enough to contain many integrated devices that are subsequently diced into a number of chips using batch fabrication.

A dielectric layer 34 can be grown or deposited on the substrate 30 to provide the gate insulator 70. The dielectric layer 34 can be a thermal oxide (e.g., silicon dioxide) or any other dielectric that provides reproducible, high-quality electrical and physical properties. The thermal oxide layer 34 for the gate oxide 70 can also be the dielectric layer 35 that provides the electrical isolation of the subsequently deposited first structural P0 layer of the MEMS device 20 from the substrate 30. When used to provide the gate oxide 70 for the integrated MOSFET 10, the thermal oxide layer 34 can be made thinner, for example 100–150 nm, and the silicon nitride layer 36 can be made thicker to provide adequate electrical and physical standoff of the MEMS device 20. Alternatively, the silicon nitride layer 36 and the underlying thermal oxide 35 that are blanket deposited on the silicon wafer 30 for the MEMS device 20 can be removed by standard photolithographic and etch processes in the electronics portion 31 of the substrate 30 to provide a bare substrate upon which a new thermal oxide layer 34 can be grown to provide a precise thickness for the gate oxide 70.

Figure 1B:
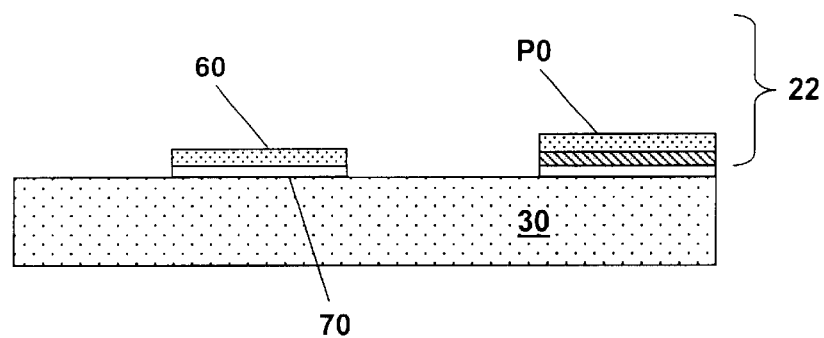
FIG. 1B shows the deposition of a first doped polysilicon layer to form the gate electrode on the gate oxide of the MOSFET and the voltage reference plane of the MEMS device.

In FIG. 1B, the gate electrode 60 can be deposited on the gate insulator 70. The gate electrode 60 can-be a standard MOS gate material. Preferably, a conductive layer is blanket-deposited on the entire wafer, then patterned to provide the MOSFET gate electrode 60 and the P0 MEMS layer. In a preferred embodiment of the present invention, the heavily doped (e.g., $10^{20}$ phosphorous atoms/cc) P0 polysilicon layer of the MEMS device structure 22 can be patterned over the gate oxide 70 to form the gate electrode 60. The polysilicon gate 60 can be about 0.3 microns in thickness and have a sheet resistance of about 20 ohms/square. The length of the polysilicon gate 60 can be varied to control the MOSFET's channel length. Short channels are preferred for higher packing densities and higher circuit speeds, but the effective electrical channel length is limited by interdiffusion of the thermally formed source and drain regions 40 and 50 and other short-channel effects. Preferably, the length of the polysilicon gate 60 can be 10–20 microns for high-voltage operation.

Figure 1C:
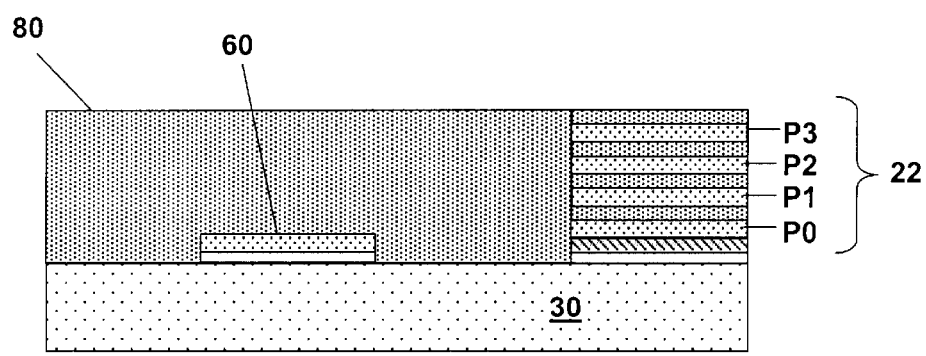
FIG. 1C shows the deposition of the inter-level dielectric (ILD) on the electronics portion of the substrate.

In FIG. 1C, an inter-level dielectric (ILD) layer 80 can be deposited on the substrate 30 to provide electrical isolation of the gate electrode 60 and the subsequently formed source, drain, and gate electrical contacts 44, 54, and 64 from each other and surrounding structures. The ILD 80 can preferably comprise one or more of the LPCVD-deposited silicon dioxide layers used to form the sacrificial oxide layers of the MEMS device structure 22. The sacrificial oxide layers (e.g., S1, S2, S3, and S4) and additional structural layers (e.g., P1, P2, and P3) can thereby be built up, with appropriate masking, to form the MEMS device 20 on the MEMS portion 32 of the substrate 30 simultaneously with the fabrication of the MOSFET 10 on the electronics portion 31 of the substrate 30.

After the MEMS device structure 22 has been partially built-up and prior to at least one of the high-temperature thermal anneal steps, electrical contacts 44, 54 and 64 can be formed through the ILD layer 80 to provide current-carrying contact from the source 40, drain 50, and gate 60 to the subsequently formed electrical interconnections 90. The plugs that form the source and drain electrical contacts 44 and 54 can also provide solid dopant sources to form the source and drain regions 40 and 50.

Figure 1D:
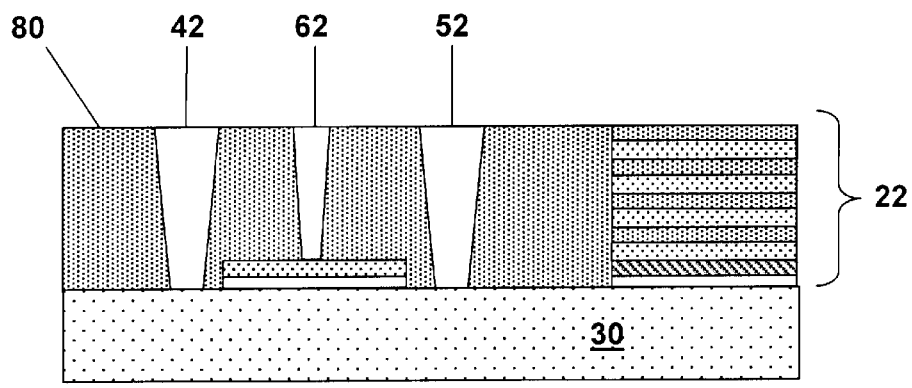
FIG. 1D shows the formation of vias in the ILD above the source and drain regions and the gate electrode.

In FIG. 1D, vias 42, 52, and 62 can first be formed down through the ILD layer 80 to open up contact holes to the substrate 30 above the source and drain regions 40 and 50 and to the gate electrode 60 by photolithography and reactive ion etching through mask openings. The source and drain vias 42 and 52 can be about 1 micron in diameter and aligned so that the edges of the source and drain contacts 44 and 54 are on opposite sides and proximate the gate electrode 60. For example, the source and drain via openings can be about one micron from the edge of the gate electrode 60.

Figure 1E:
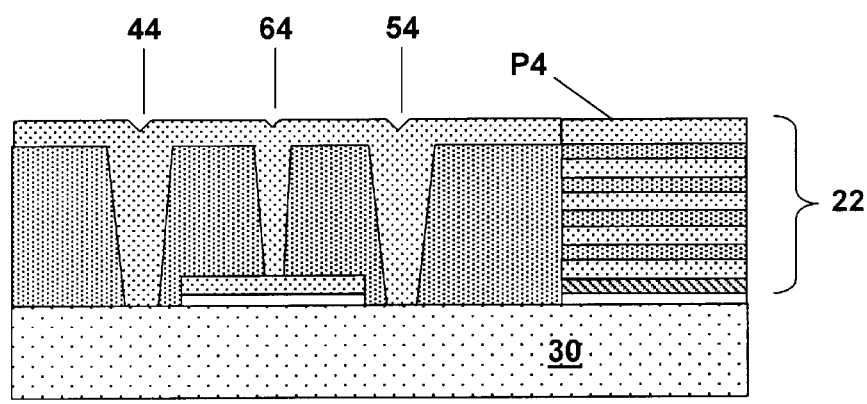
FIG. 1E shows the deposition of another doped polysilicon layer, thereby filling the vias to form electrical contacts to the MOSFET terminals and to provide solid dopant sources to form the source and drain regions.

In FIG. 1E, the via holes 42, 52, and 62 are filled with an electrically conductive material to form electrical contacts 44, 54, and 64. The conductive is material that fills the source and drain vias 42 and 52 can also provide a solid dopant source for doping by thermal diffusion of the source and drain regions 40 and 50. Preferably, the vias 42, 52, and 62 can be filled by deposition of one of the polysilicon layers (e.g., the P4 layer) during the build up of the MEMS device structure 22. For an nMOSFET, the polysilicon can be in-situ doped with a donor ion during the LPCVD process to form a source of dopant atoms for the n-type source and drain regions 40 and 50 and increase the conductivity of the electrical contacts 44 and 54. For example, a preferred dopant is phosphorous, which has a high solid solubility in polysilicon. Alternatively, for a pMOSFET, the polysilicon can be in-situ doped with an acceptor ion to form a p-type source and drain. The doped polysilicon has a higher resistivity than the metallized electrical contacts found in conventional MOSFETs. However, the higher series resistance is not a problem for driving MEMS devices, which typically require high voltage but low current.

A potential problem with doping by thermal diffusion is that surface contaminants can interfere with dopant atom diffusion. However, transmission electron micrographs of filled vias indicate the absence of any surface-blocking oxide at the interface between the solid dopant sources 44 and 54 and the silicon wafer 30. In addition, the absence of an interfacial oxide assures that the doped polysilicon forms a good ohmic contact with the silicon wafer 30.

Figure 1F:
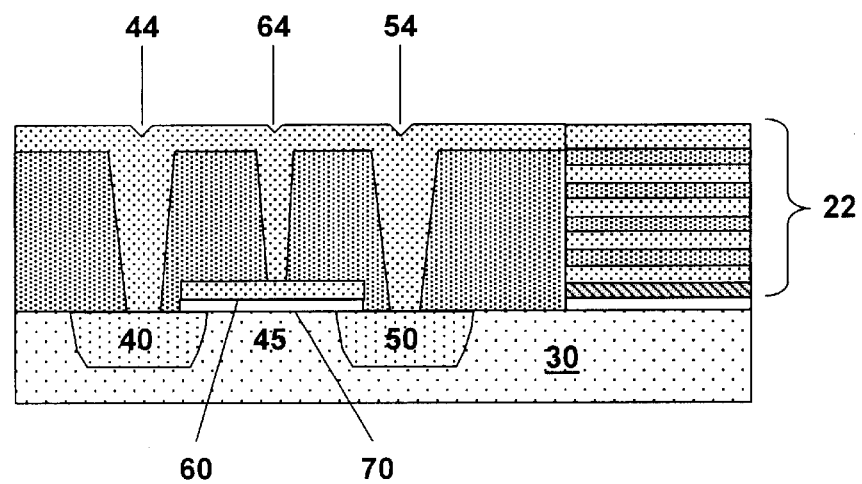
FIG. 1F shows formation of the source and drain regions by thermal diffusion of dopant into the substrate from the solid dopant sources.

In FIG. 1F, the dopant atoms can then be thermally out-diffused from the solid dopant sources 44 and 54 to form the source 40 and drain 50. The extent of the out-diffusion will depend on the time and temperature of the thermal diffusion. The lateral diffusion should be sufficient to provide source and drain regions 40 and 50 that extend at least to the edge of the gate electrode 60, yet not so large as to create excessive overlap capacitance or shorting of the channel. In addition, the heating step is preferably at a sufficiently high temperature for a sufficiently long time to relieve the stress in the structural layers 22 of the MEMS device. Preferably, the out-diffusion process can comprise at least one of the thermal anneals of the MEMS device structure 22. More preferably, the out-diffusion process can comprise the final high-temperature thermal stress-relief anneal following deposition of the final polysilicon layer (e.g., the P4 layer). Alternatively, the out-diffusion process can comprise additional thermal anneals of the intermediate structural layers of the MEMS device 20 to achieve a greater lateral extent of the source and drain regions 40 and 50.

Figure 1G:
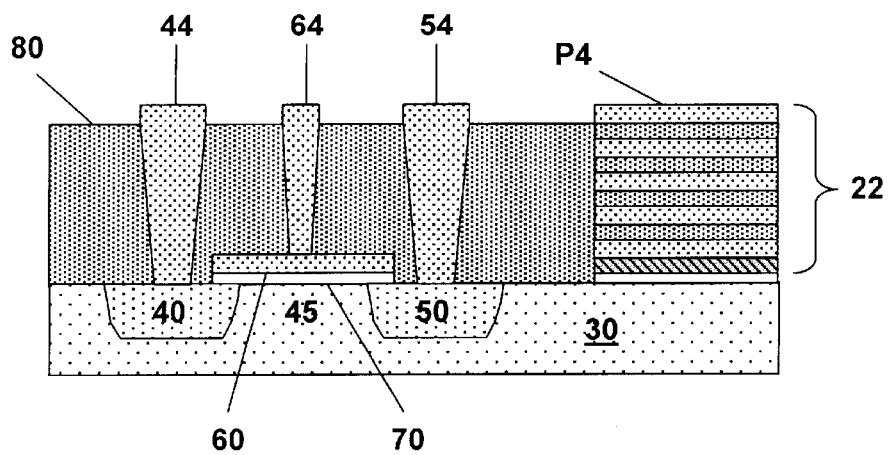
FIG. 1G shows the planarization of the polysilicon layer.

In FIG. 1G, the plugged ILD surface above the electronics portion 31 of the substrate 30 and the P4 layer of the MEMS device structure 22 can be planarized by chemical-mechanical-polishing (CMP), removing the excess polysilicon from the surface of the wafer. CMP is routinely used in integrated circuit manufacture and has been adapted also to MEMS device fabrication. The polysilicon can be removed above the ILD to provide for subsequent deposition of the electrical interconnection 90. Alternatively, the final polysilicon layer can itself be patterned to form the electrical interconnection. If the final polysilicon layer is patterned to form the electrical interconnection, planarization of the plugged ILD surface and the P4 MEMS layer may not be required.

Figure 1H:
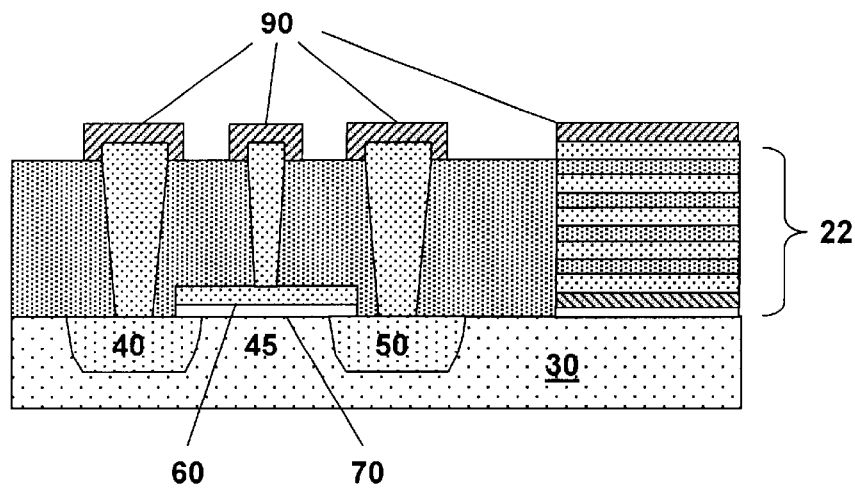
FIG. 1H shows deposition of the electrical interconnections on the electrical contacts and the final MEMS layer.

In FIG. 1H, one or more layers of electrical interconnection 90 can be provided by standard deposition and patterning steps to connect the MOSFET 10 with the MEMS device 20 and other electrical circuitry. The electrical interconnection 90 can comprise an interconnect metallization. Because all of the high temperature annealing steps can be done before the metallization, the metallization material can be a low-temperature metal. Aluminum or an alloy thereof is preferred for use as an interconnect metallization, although other metals (e.g., tungsten, gold, copper, platinum, nickel, palladium) and metal alloys (including metal silicides) can also be used. Alternatively, the electrical interconnection can be a patterned, heavily doped polysilicon layer that is also a structural layer of the MEMS device 20. For example, the electrical interconnection can be the P4 MEMS layer that can also provide the electrical contacts 44, 54, and 64.

Additional passivation layers (not shown) can be provided to separate a plurality of layers of the electrical interconnection 90 and to blanket the electronic circuitry and MEMS device structure 22 for environmental protection or controlled etch release of the MEMS device 20.

Figure 1I:
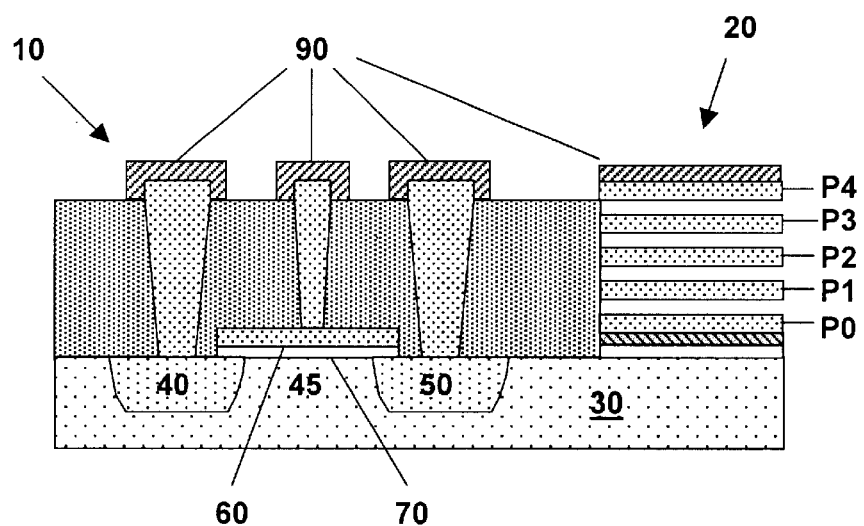
FIG. 1I shows a completed MOSFET and a released MEMS device on the common substrate.

In FIG. 1I, the MEMS device structure 22 can be released, at least partially, by selective etching of the sacrificial layers. A preferred method for releasing the MEMS device 20 is to remove the sacrificial material through the access holes, at least in part, with an HF-containing wet etchant. These wet etchants preferentially dissolve the exposed sacrificial oxide, but do not attack the polysilicon and other materials that are protected from the etchant (e.g., the ILD 80 and the gate oxide 70). After the etch release step, the substrate 30 with the protected MOSFET 10 and released MEMS device 20 can be washed in a rinse fluid for cleaning thereof and dried. In particular, standard process steps can be used for the metallization and the subsequent passivation, etch release, cleaning, and drying steps.

Figure 2:
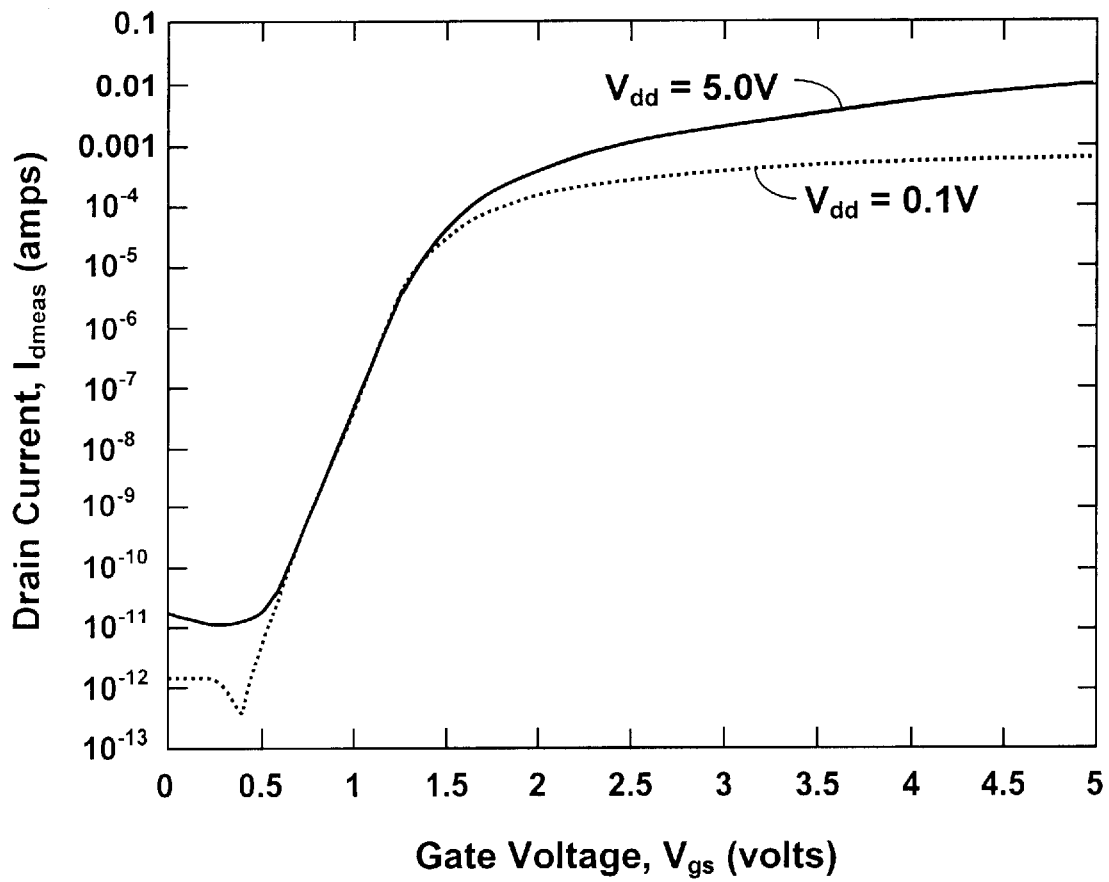
FIG. 2 shows transistor curves for diffusion-doped nMOSFETs.

In FIG. 2 are shown a typical transistor curves for a 10 micron gate nMOSFET, showing the measured drain current $I_{dmeas}$ as a function of gate voltage $V_{gs}$ for two values of the drain voltage, $V_{dd}=0.1V$ and $V_{dd}=5.0V$. The nMOSFET fabricated according to the method of the present invention displays basic device characteristics similar to a conventional, normally off MOS device. The off-state leakage current at low gate voltage is on the order of $10^{-11}$ to $10^{-12}$ amps, depending on the drain voltage. This low leakage current indicates the formation of good quality source and drain junctions. The subthreshold drain current increases gradually as the gate voltage is increased. As expected for long-channel behavior, there is no current dependence of drain current on drain voltage in the subthreshold region. The subthreshold slope, which measures the gate swing necessary to turn the switch off, is about 130 mV/decade. The subthreshold slope is slightly higher than is characteristic of a conventional MOS device (e.g., 70–100 mV/decade), but the nMOSFET of the present invention provides adequate switching characteristics for MEMS applications. Significant current flow occurs at gate voltages in excess of a threshold voltage of about 1.1 V. As the gate voltage increase further, the drain current saturates at about 1–10 milliamperes. The ratio of on current to off current is therefore about $10^9$, indicating good switch performance.

To determine the effect of the gate length on MOSFET performance, a plurality of nMOSFETs was fabricated on several silicon wafers with polysilicon gate lengths of 2, 5, and 10 microns. nMOSFETs with gate lengths of 5 and 10 microns showed nominal transistor characteristics. However, nMOSFETS having gate lengths of 2 microns displayed high drain current for all gate voltages, indicating a shorted condition because the source and drain diffusions have merged. This result is consistent with thermal diffusion modeling, which predict an overlap length of more than one micron for the thermal conditions and device geometry fabricated.

At large drain bias voltages, impact ionization can occur at the drain, leading to avalanche breakdown in the channel and an abrupt increase in drain current, independent of the gate voltage. The breakdown voltage for the nMOSFETs fabricated according to the above method with a wafer doping of about $2 \times 10^{17}$ atoms/cc and channel length greater than 5 microns had breakdown voltages of about 8 volts. This breakdown voltage is similar to a conventional CMOS having similar device geometry. Higher breakdown voltages are preferable to drive some MEMS devices, particularly those relying on electrostatic actuation. The breakdown voltage is influenced by the substrate doping concentration, channel length, and the junction curvature. See e.g., Sze, *The Physics of Semiconductor Devices*, $2^{nd}$ Edition, John Wiley & Sons, NY, pages 99–108 (1981). For one-sided abrupt junctions, the breakdown voltage scales inversely with the background impurity concentration. Field enhancement due to junction curvature can lower the breakdown voltage. In addition, the channel length must be sufficient to avoid punch-through of the depletion layer (e.g., the depletion width at 100 volts is about 5 microns). Taking these factors into account, breakdown voltages of tens of volts, adequate to drive MEMS devices, can be achieved with a nMOSFET of the present invention having substrate dopant concentration of $2-5\times10^{15}$ atoms/cc, a radius of curvature of the metallurgical junction of 2–3 microns, and a gate electrode length of greater than 8 microns. MOSFETs fabricated with these parameters have been fabricated, and performance is as expected.

The present invention has been described as the monolithic integration of a MOSFET with a MEMS device on a common substrate. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for integrating a metal-oxide semiconductor field effect transistor (MOSFET) with a microelectromechanical systems (MEMS) device on a semiconductor substrate, comprising:

forming a gate insulator of the MOSFET on an electronics portion of the substrate surface;

forming a gate electrode of the MOSFET on the gate insulator;

forming an inter-layer dielectric on the electronics portion of the substrate, thereby encapsulating the gate electrode and the gate insulator;

forming a gate electrical contact through the inter-layer dielectric to the gate electrode;

forming a source electrical contact through the inter-layer dielectric to a source region of the substrate proximate to one side of the gate electrode wherein the source electrical contact further comprises a solid dopant source;

forming a drain electrical contact through the inter-layer dielectric to a drain region of the substrate proximate to the other side of the gate electrode wherein the drain electrical contact further comprises a solid dopant source;

forming a MEMS device structure on a MEMS portion of the substrate surface comprising at least one dielectric layer on the substrate, at least one structural layer built up from the at least one dielectric layer, and at least one sacrificial layer interleaving the at least one structural layer;

heating the substrate to a sufficiently high temperature to thermally diffuse dopant atoms from the source and drain electrical contacts into the substrate to form the source and drain of the MOSFET and to relieve the stress in the at least one structural layer of the MEMS device structure;

forming electrical interconnections from the gate electrical contact, the source electrical contact, and the drain electrical contact of the MOSFET to the MEMS device structure; and removing the at least one sacrificial layer to release the MEMS device.

2. The method of claim 1, wherein the substrate comprises single crystal silicon.

3. The method of claim 2, wherein the single crystal silicon substrate is p-type and the dopant atoms comprise donors.

4. The method of claim 2, wherein the substrate further comprises a p-type well in n-type single crystal silicon and the dopant atoms comprise donors.

5. The method of claim 2, wherein the single crystal silicon substrate is n-type and the dopant atoms comprise acceptors.

6. The method of claim 2, wherein the substrate further comprises an n-type well in n-type single crystal silicon and the dopant atoms comprise acceptors.

7. The method of claim 1, wherein the gate insulator comprises a thermal oxide.

8. The method of claim 1, wherein at least one of the dielectric layers of the MEMS device also forms the gate insulator of the MOSFET.

9. The method of claim 1, wherein the gate electrode comprises doped polysilicon.

10. The method of claim 1, wherein the gate electrode of the MOSFET comprises a first structural layer of the MEMS device.

11. The method of claim 1, wherein the inter-layer dielectric comprises at least one of the sacrificial layers of the MEMS device.

12. The method of claim 1, wherein the electrical contact forming steps comprise forming vias through the inter-layer dielectric and filling the vias with an electrically conductive material.

13. The method of claim 1, wherein the source electrical contact and the drain electrical contact comprise at least one of the structural layers of the MEMS device.

14. The method of claim 1, wherein the at least one structural layer comprises polysilicon.

15. The method of claim 1, wherein the at least one sacrificial layer comprises silicon dioxide.

16. The method of claim 1, wherein the electrical interconnections comprise an interconnect metallization.

17. The method of claim 16, wherein the interconnect metallization comprises aluminum.

18. The method of claim 1, wherein the electrical interconnections comprise doped polysilicon.

19. The method of claim 1, wherein the electrical interconnections comprise at least one structural layer of the MEMS device.

* * * * *